United States Patent
Nolette et al.

(10) Patent No.: US 7,922,066 B2
(45) Date of Patent: Apr. 12, 2011

(54) METHOD OF MANUFACTURING A ROTARY SPUTTERING TARGET USING A MOLD

(75) Inventors: Al Nolette, Biddeford, ME (US); Paul Carter, Waterboro, ME (US); Dean Plaisted, Kennebunk, ME (US); Alan Plaisted, Swanton, VT (US)

(73) Assignee: Soleras, LTd., Biddeford, ME (US)

( * ) Notice: Subject to any disclaimer, the term of this patent is extended or adjusted under 35 U.S.C. 154(b) by 1238 days.

(21) Appl. No.: 11/534,205

(22) Filed: Sep. 21, 2006

(65) Prior Publication Data

US 2007/0062809 A1 Mar. 22, 2007

Related U.S. Application Data

(60) Provisional application No. 60/596,410, filed on Sep. 21, 2005.

(51) Int. Cl.
*B23K 1/00* (2006.01)
*B23K 31/02* (2006.01)
*C23C 14/00* (2006.01)

(52) U.S. Cl. .... 228/132; 228/134; 228/256; 204/298.12

(58) Field of Classification Search .......... 228/131–134, 228/256; 204/298.12, 298.21, 298.22
See application file for complete search history.

(56) References Cited

U.S. PATENT DOCUMENTS

| | | | | |
|---|---|---|---|---|
| 3,025,596 A | * | 3/1962 | Ward et al. | 228/131 |
| 4,476,151 A | * | 10/1984 | Keller et al. | 204/298.12 |
| 4,886,203 A | * | 12/1989 | Puzrin et al. | 228/126 |
| 5,317,006 A | * | 5/1994 | Kumar | 204/298.12 |
| 5,392,981 A | * | 2/1995 | Makowiecki et al. | 228/122.1 |
| 5,642,853 A | * | 7/1997 | Lee | 228/127 |
| 5,653,856 A | * | 8/1997 | Ivanov et al. | 204/192.12 |
| 6,582,572 B2 | * | 6/2003 | McLeod | 204/298.12 |
| 6,749,101 B1 | * | 6/2004 | Lee et al. | 228/107 |
| 6,787,011 B2 | * | 9/2004 | Ueda et al. | 204/298.12 |
| 2004/0074770 A1 | * | 4/2004 | Wityak et al. | 204/298.14 |
| 2004/0094283 A1 | * | 5/2004 | Weigert et al. | 164/61 |
| 2005/0092455 A1 | * | 5/2005 | Weigert et al. | 164/6 |
| 2006/0151320 A1 | * | 7/2006 | Weigert et al. | 204/298.12 |
| 2007/0074969 A1 | * | 4/2007 | Simpson et al. | 204/192.1 |
| 2009/0250337 A1 | * | 10/2009 | Simons et al. | 204/192.15 |

\* cited by examiner

*Primary Examiner* — Kiley Stoner
*Assistant Examiner* — Carlos Gamino
(74) *Attorney, Agent, or Firm* — Mesner & Deleault, PLLC

(57) ABSTRACT

The process that is the subject of this invention is a method of making a rotary sputtering target having the steps of providing a cylinder of sputtering target material having an adhesion-wetting layer on its inside surface; providing a stainless steel sputtering target backing tube having an outside diameter smaller than the sputtering target material inside diameter, the backing tube having an adhesion-wetting layer on its outside surface; welding an upper and lower stainless steel retaining ring to the backing tube adjacent to the sputtering target material so that the target material is in compression and the backing tube in tension; and introducing molten bonding material into the annulus between the backing tube and the sputtering target material.

The apparatus that is the subject of the present invention is a rotary sputtering target apparatus having a cylinder of sputtering target material; a backing tube having a smaller outside diameter than the inside diameter of the sputtering target material; and bonding material disposed between the target material and backing tube, the bonding material bonding them together.

11 Claims, 3 Drawing Sheets

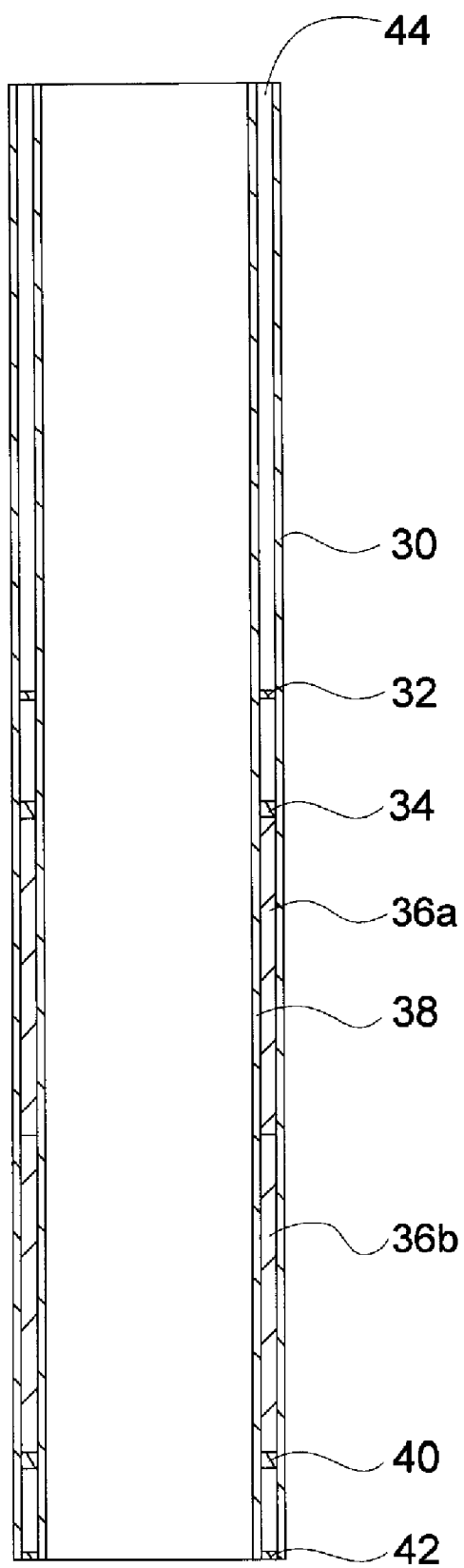
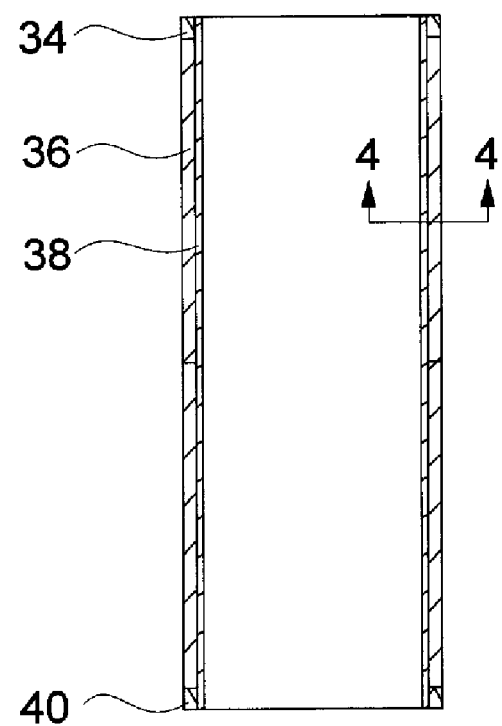
Fig. 2
Fig. 3

METHOD OF MANUFACTURING A ROTARY SPUTTERING TARGET USING A MOLD

BACKGROUND

1. Field of the Invention

The invention is in the field of sputtering targets.

2. Description of the Related Art

Sputtering is a manufacturing process that achieves thin film deposition by bombarding a target material with energetic ions. The sputtering target material becomes deposited on a work piece. Some of the products made by sputtering include mirrors, compact discs, low-E insulating glass, architectural glass, and flat panel displays.

There are two main types of sputtering targets, including planar and rotary types, each having its own set of advantages and limitations dependent upon the coating application. In large area coatings, such as architectural glass, high rates of speed and long life of the targets are desired to lower manufacturing costs and reduce downtime of the systems. In this example, rotary targets have many advantages over planar technologies and are finding wide acceptance in the industry. However, rotary targets are more complex and can be very difficult to make depending on the desired materials to be sputtered and the coating application. Because of the complexity and cost to manufacture rotary targets out of certain sputter materials, some materials are still sputtered or deposited using other techniques and cannot economically or technically take advantage of the rotary target sputter process. It is possible to sputter many different materials including for example metals, metal alloys, ceramics, nitrides, and oxides. This is just a representation of materials and not an inclusive list of application materials. Some target materials are very expensive and are more easily handled in the manufacturing process in smaller sizes until final assembly of the target. Others can be melted and poured into a mold around a backing tube and machined to final specifications after the pour. Some target materials can be very brittle, such as some materials like ITO (indium-tin oxide) used in the flat panel display industry. To construct long cylinders of the target material to be fit into a rotary cathode can be cost prohibitive with traditional techniques known in the art. In addition, some target materials are easily destroyed during manufacturing due to a variety of reasons including but not limited to brittleness, thermal sensitivity, low impact strength, bonding failures, differing rates of thermal expansion and other properties. In the sputtering process, cycling temperatures, vacuum conditions, high sputter surface plasma temperatures, fixturing integrity, liquid cooling of the tube, operating long term at high power levels, and other parameters can all contribute to the failure or pre-mature failure of the rotary target.

The typical way of making rotary sputtering targets using brittle materials for example, has been to bond the brittle target material to a stainless steel backing tube with an indium-based bonding material. Indium as a bonding material has a relatively low melting temperature of 157 degrees C (314 degrees F). Because of the low melting temperature, it can withstand only a low amount of thermal stress. Indium-based bonding material is very expensive, costing around U.S. $1102 per kilogram (U.S. $500 per pound) at the time this specification is being written. However, the low melting temperature of the bonding material is also a disadvantage under certain conditions, such as a coolant failure or flow restriction of the cooling system that maintains an adequate process temperature of the cathode during its use. A system cooling failure may inadvertently raise the target temperature above the bonding material's melting point resulting in a failure of the target and significant expense, and/or downtime of the system involved. As an additional example, a process may be desired that would operate the target at temperatures that may exceed the melting point of the bonding material, perhaps toward the end of the target's rated life where the erosion pattern of the target gets closer to the bonding layer of the target. A target manufactured with a higher melting point bonding material would be less sensitive to the process application and be able to operate at higher power levels and faster speeds utilizing bonding materials appropriate to the application in terms of performance and cost. The ability to use a broader range of bonding materials allows the optimization of the rotary target design to accommodate different target material's thermal, mechanical, and processability requirements. Bonding materials appropriately selected for a specific process can improve performance, reduce cost, and improve reliability. In a coating system for architectural glass for example with a large number of targets installed, these advantages become very significant in terms of reduced operating cost, less downtime, and faster process speeds.

SUMMARY

The present invention satisfies the need for a rotary sputtering target and method of manufacturing that can use a wide range of target and bonding materials. The process that is the subject of this invention is a method of making a rotary sputtering target comprising the steps of providing a cylinder of sputtering target material having an adhesion-wetting layer on its inside surface; providing a sputtering target backing tube having an outside diameter smaller than the sputtering target material inside diameter, the backing tube having an adhesion-wetting layer on its outside surface; placing spacers in the annulus between the backing tube and the sputtering material; welding an upper and lower retaining ring to the backing tube adjacent to the sputtering target material holding the target material in compression and the backing tube in tension; and introducing molten tin-based bonding material into the annulus between the backing tube and the sputtering target material.

The product that is the subject of the present invention is a rotary sputtering target and the manufacturing apparatus and process comprising a cylinder or stack of cylindrical segments of sputtering target material; a backing tube having a smaller outside diameter than the inside diameter of the sputtering target material; bonding material disposed between the target material and backing tube, and the bonding material such as tin bonding material bonding the target material and backing tube together. The manufacturing apparatus includes techniques to pour the bonding material in a vacuum environment between the target material and backing tube, and methods for providing compression of the target segments during the bonding process. These and other features, aspects, and advantages of the present invention will become better understood with reference to the following description, drawings, and claims.

DRAWINGS

FIG. 2 is a sectional view showing the apparatus used in making the present invention.

FIG. 3 is an apparatus according to the present invention.

DESCRIPTION

Figure 1:
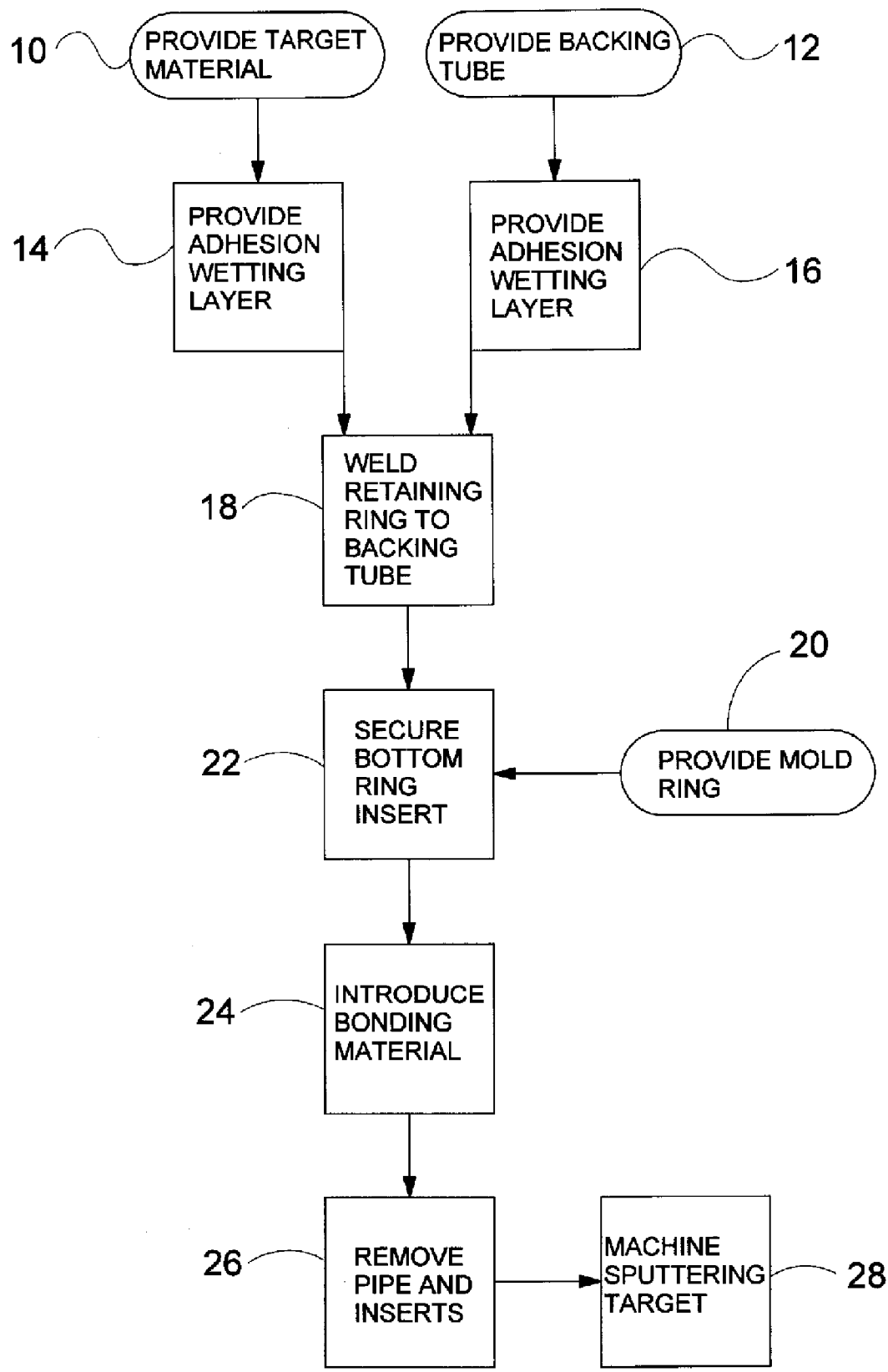
FIG. 1 is a flow chart showing the method of the present invention.

An embodiment of the invention is the stacking of target material segments with a backing tube going through their centers. In the case of high value and/or brittle target materials, this method of manufacture is highly desirable. It is critical that no bonding material be allowed to melt into and/or solidify between the segment interfaces, and that the segments themselves are stacked and bonded in a precisely aligned column, centered around the backing tube.

The invention provides a manufacturing method and assembled apparatus to achieve void-free bonding without bond material between the target material segments. The target segments are first stacked with a central backing tube aligning the stack. Spacers are placed between the target segments and the backing tube along the full length of the desired target. These can be made of wire of a given diameter, machined spacers to a given dimension, or another method of centering the segments co-axially around the backing tube. The spacers are located within the bonding material gap and become part of the bonding layer in the finished product. The backing tube acts as the central structure during the manufacturing of the target. Due to the high temperatures involved in the melting and flowing of the bonding material around the backing tube at lengths that can extend to over four meters in length, it is not unusual to experience distortion of the backing tube and creating a rotary target that is not straight but has physical deformations about the central axis. Leakage of bonding material between the segments can also cause thermal expansions which can create stresses within the target material and cause cracking, bond separation, sputter impurities, and target failure.

An embodiment of this invention is maintaining a compressive force on the stack of target segments during the bonding process. This can be accomplished in many ways, such as the installation of jacking screws in the assembly apparatus or even with weighted loading of the stack. This provides bonding material-free interfaces between the target material segments.

A further embodiment of this invention is pre-stressing the backing tube in tension while providing a compressive force on the target material segments in the stack. The pre-stressed backing tube remains straight in tension even at elevated temperatures while the stack of target material segments remains in compression throughout the range of temperature cycles experienced during both the manufacturing process and actual usage of the target in a coating system. A backing tube in tension can be optimized to minimize stress in the bonding layer during thermal cycling of the rotary target during operation and reduce the incidence of bonding failures within the rotary target. Combining the compression of the stack with the backing tube in tension, using spacers to keep the stack centered co-axially around the backing tube, and encasing the target in vacuum during the bonding process are all important features of the invention.

In addition, a further embodiment of the invention is the application of an adhesion-wetting layer on both the outer surface of the backing tube, and the inner surface of the target material segments. For example this can be achieved through electroless nickel plating, sputter deposition, plasma spray, flame spray, painting on a coating, brushing on the coating, dipping, powder coating, vacuum coatings such as PVD, cathodic arc deposition, evaporation, and many other techniques to apply the wetting adhesive layer to the identified bonding surfaces.

An additional embodiment of the invention is the use of a high temperature barrier layer between the target segments or on the inner diameter of the joints of the target segments that would prevent leakage of the bonding material through the target segment interfaces. For example, a high temperature tape such as KAPTON tape could be placed internally around all of the segment interfaces to prevent bonding material from flowing into the segment interfaces. The segment interfaces can also be machined to interlock or to mate together in a profiled shape that helps to keep the segment stack properly aligned and would create a barrier to the bonding material from leaking through the segment interfaces. To illustrate the above embodiments of the invention and a developed manufacturing method, a rotary target consisting of stacked target segments has been constructed, successfully bonded, and operated in a vacuum deposition system at high power densities. The process that is the subject of this invention is a method of making a rotary sputtering target comprising the steps of providing a cylinder of sputtering target material having an adhesion-wetting layer on its inside surface; providing a stainless steel sputtering target backing tube having an outside diameter smaller than the sputtering target material inside diameter, the backing tube having an adhesion-wetting layer on its outside surface; welding an upper and lower retaining ring to the backing tube on either side of the sputtering target material; and introducing molten tin-based or other bonding material into the annulus between the backing tube and the sputtering target material.

Turning to FIG. 1, at least one cylinder of sputtering target material must be provided 10. FIG. 2 shows two stacked end to end 36a, 36b, but a different number could be used. In this embodiment, a 304 stainless steel sputtering target backing tube is provided 12. The inside surface of the target material and the outside surface of the backing tube should be provided with an adhesion-wetting layer 14, 16. The adhesion-wetting layer should be a material that the selected bonding material will adhere to and wet to, preferably nickel, copper, or tin. In this case the adhesive wetting layer is nickel and was applied through electroless nickel plating. The sputtering target material is then placed coaxially over the backing tube with spacers inserted between the tube and target material segments to maintain an even co-axial bonding gap between the tube and target segments. In this case wire of an appropriate diameter was used at 120-degree intervals around the backing tube.

The next steps are welding a lower retaining ring, in this case made of stainless steel, to the backing tube 18. Then the target material is slid over the backing tube. A preload to the target segments can be achieved in a variety of ways, such as the use of jacking screws compressing the ring onto the top of the segmented target material stack. In this way fine adjustments can be made to the compressive force on the stack and the final tension in the backing tube. The temperature of the backing tube can also be varied as the assembly can be heated in the center of the tube as well as externally to the rotary target assembly.

In order to achieve compression of the target segments and tension along the length of the backing tube, the backing tube is then heated so that it expands in length through the center of the target segments. When the appropriate temperature is reached, in this case 427 degrees C (800 degrees F), the top retaining ring is welded to the tube after making sure that it is in compressive contact to the target segments. After welding, the backing tube cools and shrinks in length providing compression on the target material stack and creating tension along its entire length. Depending on the process, target material, and bonding materials used the tension in the backing tube can range from zero to the limits of the structural integrity of the backing tube. Therefore, the embodiments of the invention are achieved through this manufacturing process.

The next step provides a mold ring 20 having an inside diameter greater than the outside diameter of the sputtering target material. The mold ring in this example is stainless steel, and is placed coaxially over the backing tube and sputtering target material assembly.

A top ring insert is secured between the backing tube and the mold pipe over the upper retaining ring, and a bottom ring insert is secured between the backing tube and the lower retaining ring 22. They are secured preferably by welding, and with the mold ring define a cavity capable of accepting molten bonding material.

Molten bonding material is then introduced into the annulus between the backing tube and sputtering target material 24. The bonding material used was tin-based because of its economics and performance criteria. Tin bonding material costs only about U.S. $9 per kilogram (U.S. $4 per pound) at the time of writing this specification. Tin-based bonding material costs on the order of one percent of the cost of indium-based bonding materials used in the prior art. Tin-based bonding material melts at 230 degrees C (450 degrees F), and therefore introduces greater thermal stresses and thermal expansion, but also provides a bond with higher temperature capabilities in the process of operating the target and better system failure mode capability. Tin can be used by following the process of the present invention. Silver-based bonding material and tin-indium based bonding material can also be used. The use of these bonding materials is enabled by the invention described in this application of the rotary target design and its associated manufacturing process.

The next steps in the process are waiting a sufficient time for the bonding material to solidify, and removing the mold pipe, top ring insert, and bottom ring insert 26. The final step is machining the outside surface of the sputtering target material 28 to expose a pure material surface to the sputtering beam during use. The selected method of machining is grinding, because turning on a lathe may break the brittle material used in this example. Other post machining steps may be used depending on material and application.

FIG. 2 is a cross section view showing how the product is made using the process that is the subject of the present invention. Because of the scale of the drawing, the adhesion-wetting layers and bonding material layer are not shown.

In FIG. 2, at least one cylinder of sputtering target material 36 is provided, and is disposed coaxially over a backing tube 38. An upper retaining ring 34 is secured on one end of the backing tube 38, preferably by welding. Likewise, a lower retaining ring 40 is secured on an end of the backing tube 38 opposite the upper retaining ring 34 and adjacent to the sputtering target material, preferably by welding.

A cylindrical, stainless steel mold pipe 30 is provided, and is disposed coaxially over the work product. A top ring insert 32 can be secured between the backing tube 38 and the mold pipe 30 above the upper retaining ring 34. A bottom ring insert 42 can be secured between the backing tube 38 and the mold pipe 30 below the lower retaining ring 40. Molten bonding material is introduced into the annulus 44 between the backing tube 38 and the sputtering target material 36. Although some molten bonding material may solidify between the mold pipe 30 and the target material 36, it will be machined away before use.

Figure 4:
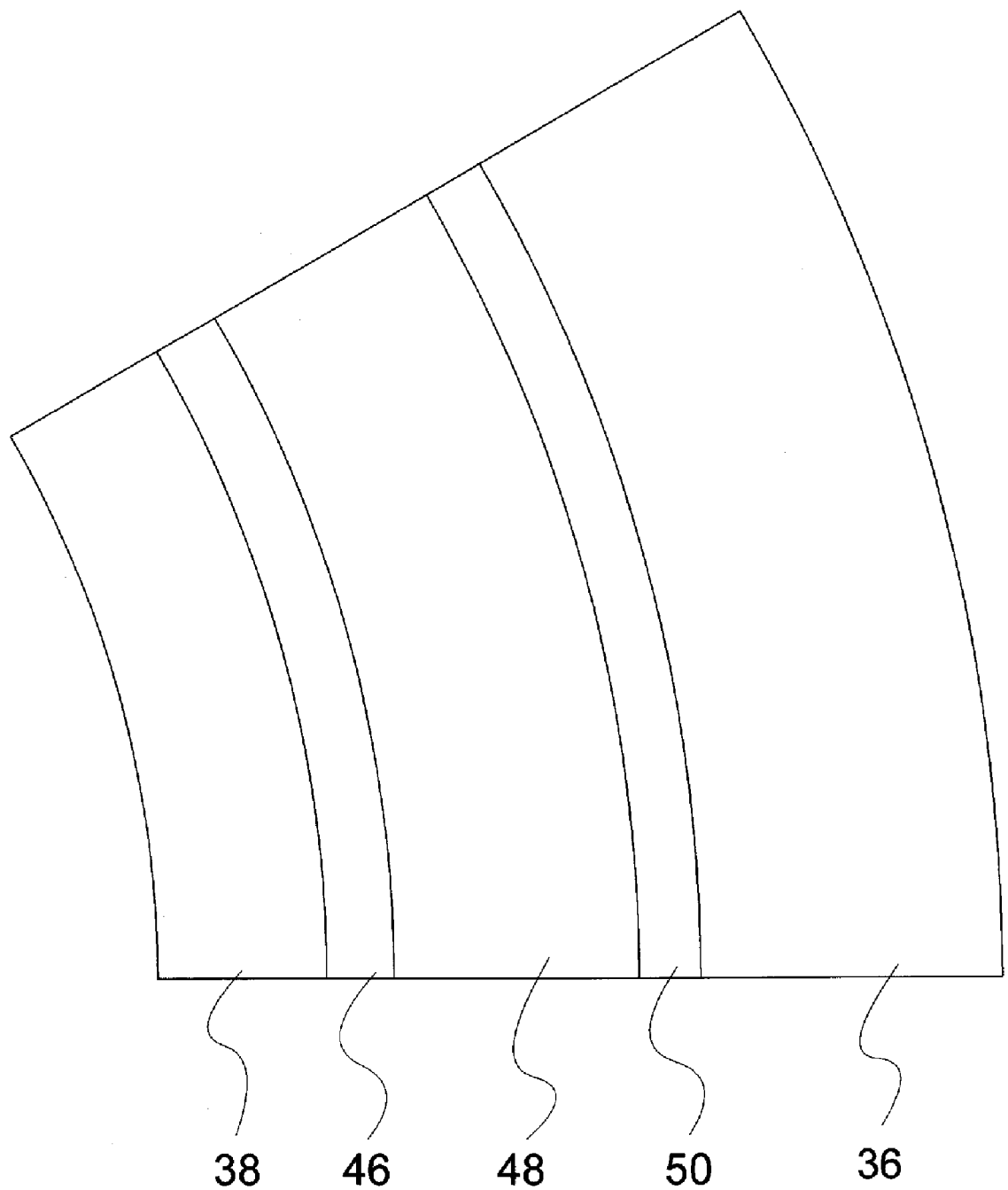
FIG. 4 is a cross section of the apparatus of FIG. 3.

Turning to FIGS. 3 and 4, the apparatus that is the subject of the present invention is a rotary sputtering target apparatus comprising a cylinder of sputtering target material 36; a backing tube 38 having a smaller outside diameter than the inside diameter of the sputtering target material; and bonding material 48 disposed between the target material 36 and backing tube 38, the bonding material bonding them together. The backing tube 38 has a smaller outside diameter than the inside diameter of the sputtering target material 36 so that it can be coaxially disposed inside the target material 36. Preferably, a wetting-adhesion layer 46 is disposed on the outside diameter of the backing tube 38, and on the inside diameter of the target material 36. The wetting-adhesion layer is made of a material that is capable of wetting and adhering to the bonding material selected for the particular job. The wetting-adhesion layer is preferably based on, or made of, nickel, copper, or tin. The wetting-adhesion layer is preferably disposed the aforementioned surfaces by sputtering, plating, or an equivalent process. The bonding material 48 can be a tin-based bonding material.

Preferably, a wetting-adhesion layer 50 is also disposed between the bonding material 48 and target material 36. This layer 50 may have the same composition as the other layer 46, but it is not necessary that they are the same.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

We claim:

1. A method of making a rotary sputtering target comprising the steps of:
    providing a backing tube having an outside diameter smaller than a sputtering target material inside diameter;
    providing at least one cylinder of sputtering target material and up to multiple cylindrical segments of target material stacked upon one another coaxially stacked onto the backing tube, the tube occupying the center of the stack or individual cylinder;
    introducing molten bonding material into the annulus between the backing tube and the sputtering target material; and
    providing a cylindrical stainless steel mold pipe, the mold pipe having an inside diameter greater than the outside diameter of the sputtering target material.

2. The method of claim 1 further comprising the step of applying an adhesion-wetting layer on the inside surface of the target material cylindrical segments.

3. The method of claim 1 further comprising the step of applying an adhesion-wetting layer on the outside surface of the target material cylindrical segments.

4. The method of claim 2 wherein the adhesion-wetting layer is applied onto the sputtering target material inside surface further by vacuum deposition.

5. The method of claim 3 wherein the adhesion-wetting layer is applied onto the sputtering target material outside surface further by vacuum deposition.

6. The method of claim 1 further comprising the step of pulling a vacuum in the annulus between the backing tube and the sputtering target material before introducing molten bonding material.

7. The method of claim 1 further comprising the steps of:
    securing a top ring insert between the backing tube and the mold pipe above an upper retaining ring; and
    securing a bottom ring insert between the backing tube and the mold pipe below a lower retaining ring.

8. The method of claim 7, wherein the backing tube is in tension and the cylinder stack is in compression after the ring inserts are secured to the backing tube.

9. The method of claim 7, wherein the securing is performed by welding.

10. The method of claim 7 further comprising the steps of:
    waiting a sufficient time for the molten bonding material to solidify after introducing the molten bonding material; followed by
    removing the mold pipe, top ring insert, and bottom ring insert.

11. The method of claim 10 further comprising the step of machining the outside diameter of the target material to expose uncoated material.

* * * * *